US010244640B2

(12) United States Patent
Kuwako et al.

(10) Patent No.: US 10,244,640 B2
(45) Date of Patent: Mar. 26, 2019

(54) COPPER CLAD LAMINATE PROVIDED WITH PROTECTIVE LAYER AND MULTILAYERED PRINTED WIRING BOARD

(71) Applicant: MITSUI MINING & SMELTING CO., LTD., Tokyo (JP)

(72) Inventors: Fujio Kuwako, Saitama (JP);
Toshifumi Matsushima, Saitama (JP);
Toshihiro Hosoi, Saitama (JP); Ayumu Tateoka, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 15/111,315

(22) PCT Filed: Feb. 19, 2015

(86) PCT No.: PCT/JP2015/054636
§ 371 (c)(1),
(2) Date: Jul. 13, 2016

(87) PCT Pub. No.: WO2015/125873
PCT Pub. Date: Aug. 27, 2015

(65) Prior Publication Data
US 2016/0360624 A1    Dec. 8, 2016

(30) Foreign Application Priority Data

Feb. 21, 2014   (JP) .................................. 2014-031398

(51) Int. Cl.
*H05K 3/02* (2006.01)
*H05K 3/46* (2006.01)
(Continued)

(52) U.S. Cl.
CPC ......... *H05K 3/4626* (2013.01); *H05K 1/0298* (2013.01); *H05K 1/09* (2013.01);
(Continued)

(58) Field of Classification Search
None
See application file for complete search history.

(56) References Cited

U.S. PATENT DOCUMENTS 4,023,998 A * 5/1977 Cederberg ........... H05K 3/0047
156/247
5,822,856 A * 10/1998 Bhatt .................... H05K 1/113
174/262

(Continued)

FOREIGN PATENT DOCUMENTS

JP          4-354180        12/1992
JP         2001-15919        1/2001
(Continued)

OTHER PUBLICATIONS

Official Action, along with English-language translation thereof, in KR Appl. No. 10-2016-7021167 dated Oct. 19, 2016.
(Continued)

*Primary Examiner* — Callie E Shosho
*Assistant Examiner* — Daniel D Lowrey
(74) *Attorney, Agent, or Firm* — Greenblum & Bernstein, P.L.C.

(57) ABSTRACT

An object of the present invention is to provide a multilayered printed wiring board provided with split through holes excellent in through-hole formability and co-planarity in inner layer wirings around through holes for providing of a conduction isolation portion. To achieve the object, "a copper clad laminate provided with a protective layer for manufacturing of a printed wiring board having a conduction isolation portion electrically isolating a through hole, the copper clad laminate is characterized in that the copper clad laminate is provided with a protective layer on the surface that can be released after forming of the through holes for providing of a conduction isolation portion and
(Continued)

filling of the through holes for providing of a conduction isolation portion by a plating resist" is employed.

9 Claims, 4 Drawing Sheets

(51) Int. Cl.
  *H05K 3/42* (2006.01)
  *H05K 1/02* (2006.01)
  *H05K 1/09* (2006.01)
(52) U.S. Cl.
  CPC ............ *H05K 3/022* (2013.01); *H05K 3/429* (2013.01); *H05K 2201/0187* (2013.01); *H05K 2201/09645* (2013.01)

(56) References Cited

U.S. PATENT DOCUMENTS

| | | | | |
|---|---|---|---|---|
| 6,280,851 | B1 * | 8/2001 | Pasternack | ................ B32B 7/06 361/750 |
| 6,319,620 | B1 * | 11/2001 | Kataoka | ................... C25D 1/22 174/255 |
| 2002/0092677 | A1 | 7/2002 | Farquhar et al. | |
| 2002/0164468 | A1 | 11/2002 | Farquhar et al. | |
| 2005/0079289 | A1 | 4/2005 | Farquhar et al. | |
| 2013/0269985 | A1 | 10/2013 | Tahara et al. | |
| 2014/0190733 | A1 | 7/2014 | Dudnikov, Jr. et al. | |

FOREIGN PATENT DOCUMENTS

| | | | |
|---|---|---|---|
| JP | 2004-281437 | | 10/2004 |
| JP | 2004327510 A | * | 11/2004 |
| JP | 5179883 | | 4/2013 |
| TW | I313577 | | 8/2009 |
| TW | 201247045 | | 11/2012 |
| WO | 2006/094307 | | 9/2006 |
| WO | 2013/097539 | | 7/2013 |

OTHER PUBLICATIONS

Official Action, along with English-language translation thereof, for TW Appl. No. 104105894 dated Jul. 12, 2016.
International Search Report for JP2015/054636 dated May 12, 2015.

* cited by examiner

COPPER CLAD LAMINATE PROVIDED WITH PROTECTIVE LAYER AND MULTILAYERED PRINTED WIRING BOARD

TECHNICAL FIELD

The present invention relates to a copper clad laminate provided with a protective layer composed of a resin layer for preventing contamination and damage to a copper layer on a surface of the copper clad laminate, and to a multilayered printed wiring board manufactured by using the copper clad laminate provided with a protective layer.

BACKGROUND ART

In recent years, methods of manufacturing a printed wiring board in which the transmission performance of electric signals in a through hole is improved by splitting a conductive region in the through hole of a multilayered printed wiring board (hereinafter referred to as a printed wiring board provided with split through holes) by arranging a plating resist in a predetermined position in the inner layer through holes have been proposed.

Patent Document 1 discloses the method to prevent forming of a straight conductive material in via structure (corresponding to the "through hole" referred to in the present invention) by providing one or more intended voids made of plating resists in via structure. As a result, the forming of a conductive material in via structure is limited only on a region required for the transmission of electric signals. Application of such a method is advantageous because a desired multilayered printed wiring board can be manufactured by "lamination all at once". In the conventional manufacturing method of a multilayered printed wiring board, as printed-wiring boards (PCB) are sequentially laminated a plurality of sub-assemble PCBs are individually prepared, followed by laminating sub-assemble PCB to finish a multilayered wiring board. In the manufacturing method, a plurality of laminating steps are necessary until intended multilayered structure is achieved, and after each lamination, additional process for plating through holes and/or via structure may be also required. So, increased manufacturing cost and cycle time have been disadvantage.

FIG. 10 of Patent Document 1 is "a drawing showing stacked PCB in specific embodiment, and a split plated via structure are formed by selectively providing plating resist in gap formed in a conductive layer and an adjacent dielectric layer of a sub-composite structures". The plated via structure 1030 in FIG. 10 is split into a plurality of electrically isolated portions (1030a and 1030b) by selectively providing plating resist in a sub-composite structure used in manufacturing of the stacked PCB.

DOCUMENT CITED

Patent Document

[Patent Document 1] Japanese Patent No. 5179883

SUMMARY OF INVENTION

Problems to be Solved by Invention

However, in the manufacturing process of the multilayered printed wiring board disclosed in Patent Document 1, a step of forming a sub-composite (printed wiring board) is necessary to split via structure into electrically isolated portions. The sub-composite has through holes in the area for forming via structure, and a process of filling the hole with a plating resist is required.

In the manufacturing process of the sub-composite disclosed in Patent Document 1, filling method of through holes for providing of a conduction isolation portion with a plating resist may employ stencil printing and needle dispensing. If such a filling method is employed, a plating resist may adhere and remain around the opening of the through holes for providing of a conduction isolation portion filled with the plating resist is drawback, because a desired wiring cannot be formed around the opening of the through holes for providing of a conduction isolation portion.

So, a method in which the plating resist does not remain around the opening of the through holes for providing of a conduction isolation portion filled with the plating resist even if a plating resist is filled into through holes for providing of a conduction isolation portion formed in a copper clad laminate has been demanded. At the same time, a method in which a copper layer of a copper clad laminate is not damaged if through holes for providing of a conduction isolation portion is formed by drilling has been demanded.

Means to Solve Problem

As a result of diligent study, the present inventors have thought out that the problems described above can be solved by using a copper clad laminate provided with a protective layer described later. The summary of the copper clad laminate provided with a protective layer according to the present invention will be described.

The copper clad laminate provided with a protective layer according to the present invention is a copper clad laminate used for a printed wiring board having a conduction isolation portion electrically isolating a through hole characterized in that the copper clad laminate is provided with a protective layer on the surface that can be released after forming of the through holes for providing of a conduction isolation portion and filling of the through holes for providing of a conduction isolation portion by a plating resist.

Advantages of Invention

The copper clad laminate provided with a protective layer according to the present invention is excellent in the biting performance of a drill edge at the drilling start and prevents damage on a surface of a copper layer of the copper clad laminate in the drill working because the copper clad laminate is provided with a protective layer. Further, as the protective layer has enough strength, excellent releasing of the protective layer after finishing filling through holes for providing of a conduction isolation portion with a plating resist may be achieved because the protective layer has enough strength. Further, a level difference generated by a plating resist projection can be reduced because thickness of the protective layer in the copper clad laminate provided with a protective layer according to the present invention can be made thin. So, a multilayered printed wiring board provided with split through holes excellent in level difference elimination properties by an insulating layer constituting material laminated on a plating resist and excellent in co-planarity of the surface of the insulating layer constituting material around a through hole and of a wiring can be manufactured.

PREFERRED EMBODIMENTS OF INVENTION

The embodiments of the copper clad laminate provided with a protective layer according to the present invention will be described with reference to drawings. To make understanding of a copper clad laminate provided with a protective layer 1 according to the present invention easy, the manufacturing method of a multilayered printed wiring board 10 manufactured by using the copper clad laminate provided with a protective layer 1 according to the present invention will be described first, and then the copper clad laminate provided with a protective layer 1 according to the present invention will be described.

<Multilayered Printed Wiring Board According to the Present Invention>

Figure 2:
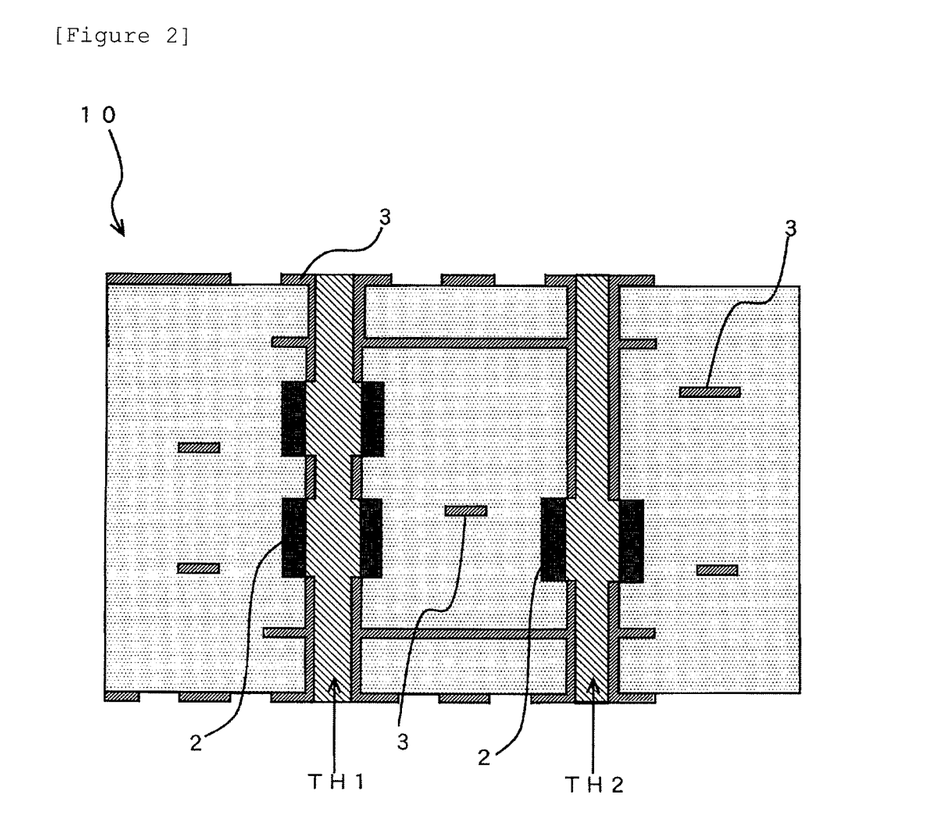
FIG. 2 is a schematic cross sectional image showing an example of a multilayered printed wiring board manufactured by using the copper clad laminate provided with a protective layer according to the present invention.

FIG. 2 shows one example of a schematic cross sectional image of the multilayered printed wiring board 10. The multilayered printed wiring board 10 shown in FIG. 2 is manufactured through processes shown in FIGS. 3 and 4, and a printed wiring board sPCB 2 and a printed wiring board sPCB 3 shown in FIG. 3 have a conduction isolation portion 2 for partially isolating electrical connection between layers. The manufacturing process of the multilayered printed wiring board 10 will be specifically described.

Figure 3:
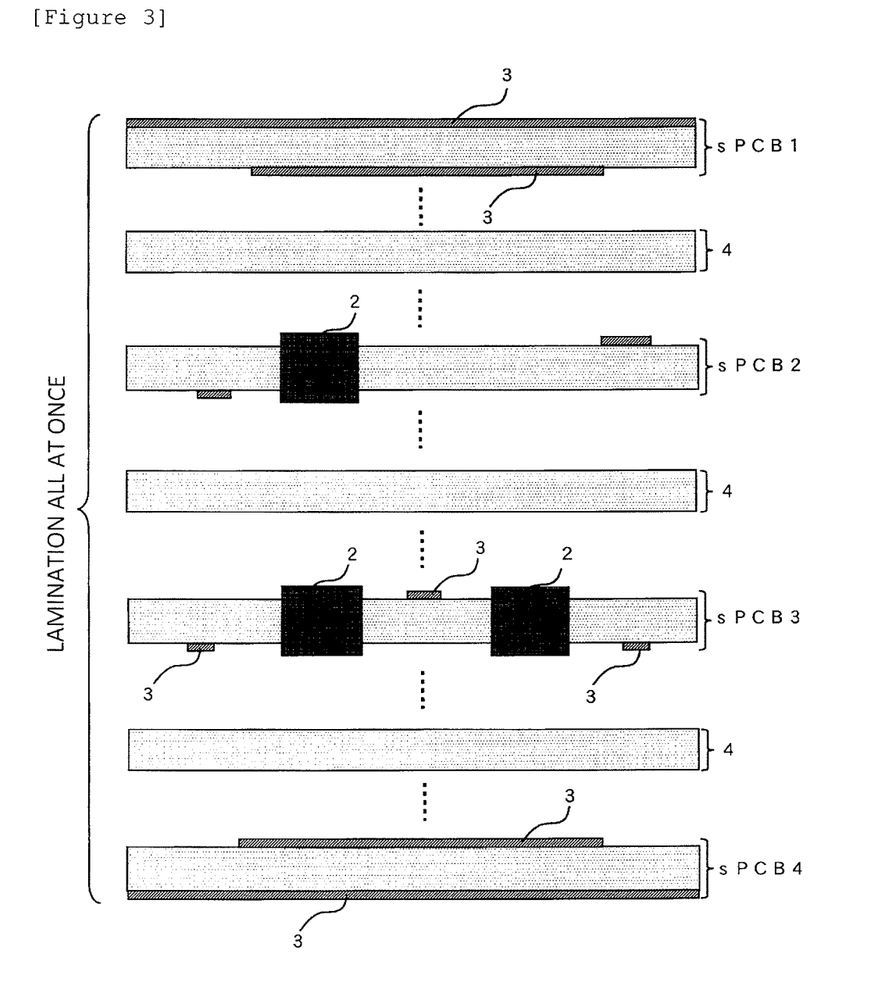
FIG. 3 is a schematic cross sectional image showing a process of manufacturing a multilayered printed wiring board manufactured by using the copper clad laminate provided with a protective layer according to the present invention.

The multilayered printed wiring board 10 is manufactured by "lamination all at once" using a plurality of double-sided printed wiring boards and insulating layer constituting materials as shown in FIG. 3. That is, the multilayered laminate shown in FIG. 4(A) is manufactured by using double-sided printed wiring boards sPCB 1, sPCB 2, sPCB 3 and sPCB 4 which should constitute a multilayered printed wiring board as shown in FIG. 3, wherein the insulating layer constituting materials 4 such as pre-preg prepared by impregnating the resin into a skeletal material such as glass cloth or glass paper, or a resin film are inserted between the layers of these printed wiring boards, and lamination all at once is conducted by a method such as press lamination or roll lamination.

Figure 4:
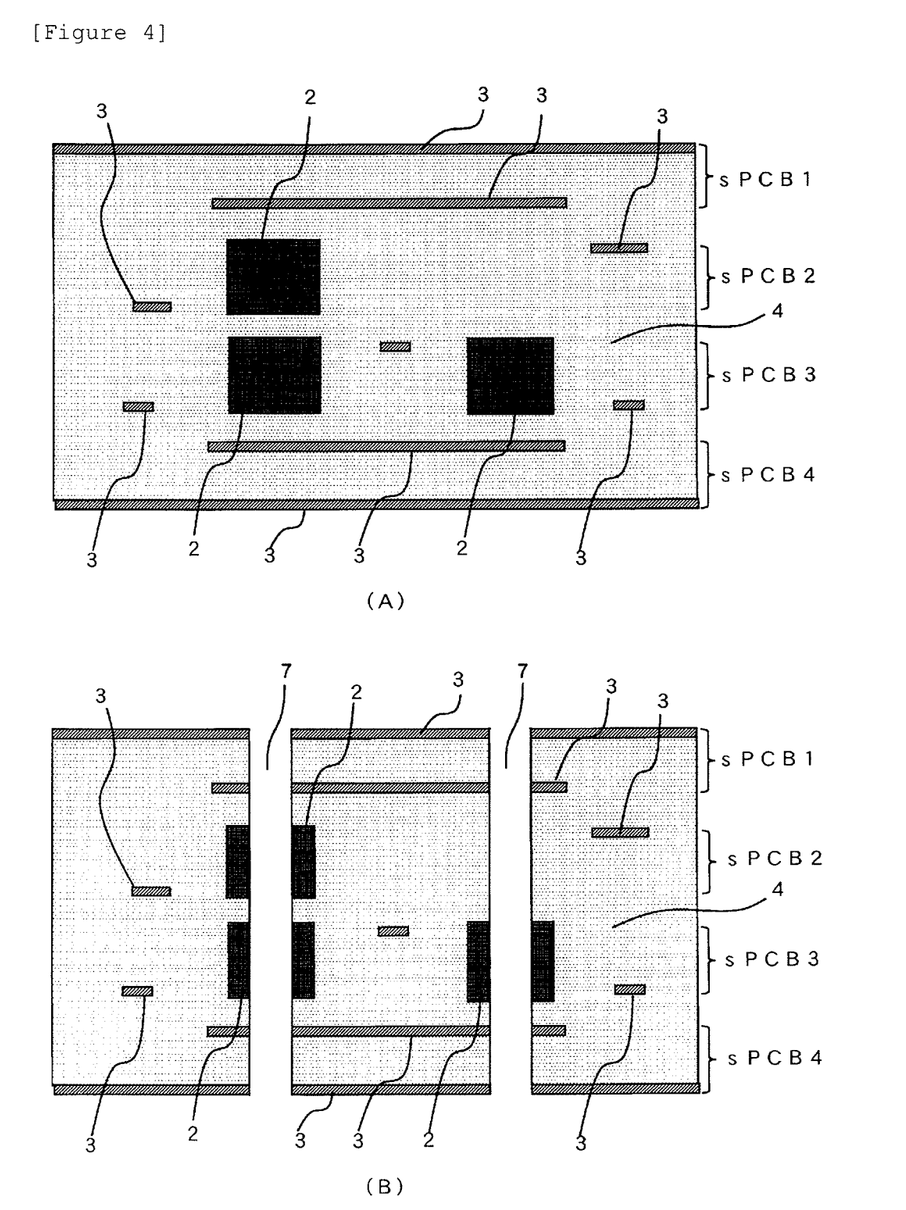
FIG. 4 is a schematic cross sectional image showing a process of manufacturing a multilayered printed wiring board manufactured by using the copper clad laminate provided with a protective layer according to the present invention.

Then, the through holes 7 penetrating both the central portion of a conduction isolation portion 2 and the multilayered laminate is formed by drilling at a place where the conduction isolation portion 2 is provided, as shown in FIG. 4(B). As the opening diameter of the through holes 7 is smaller than the diameter of the conduction isolation portion 2, the constituent material of the conduction isolation portion 2 exposes in the inner wall of the through holes 7 after drilling.

The multilayered printed wiring board 10 shown in FIG. 2 is manufactured by conducting de-smear treatment and through hole plating on the multilayered laminate having a through holes 7 in FIG. 4(B) followed by wiring forming on outer copper layer 3 (the outer copper layer 3 includes a plated copper layer). Note that the through holes 7 in FIG. 4(B) correspond to the through holes TH1 and TH2 shown in FIG. 2. In the through holes TH1 and TH2, vertical electrical connection between layers is isolated by the conduction isolation portions 2, and the layers constituting the multilayered printed wiring board 10 are divided into a plurality of electrical segments.

The copper clad laminate provided with a protective layer 1 according to the present invention is used in manufacturing of the printed wiring board sPCB 2 and the printed wiring board sPCB 3 each having the conduction isolation portion 2 shown in FIG. 3, that are used in the manufacturing of the multilayered printed wiring board 10 described above.

Figure 1:
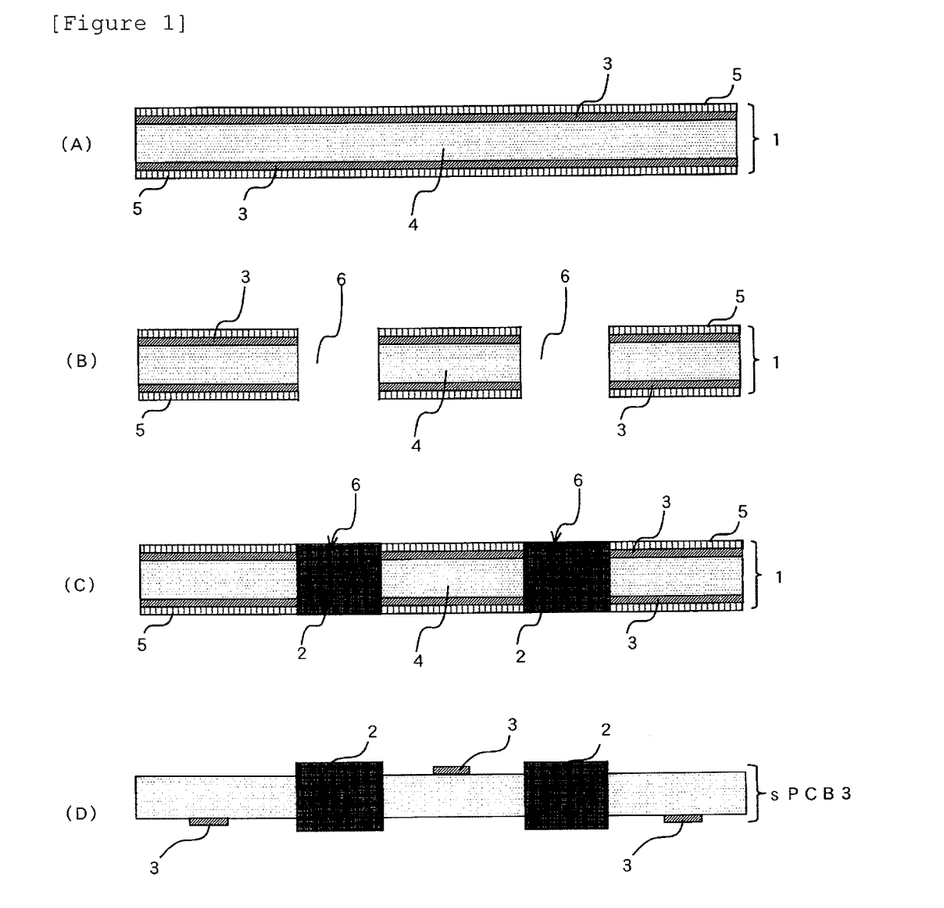
FIG. 1 is a schematic cross sectional image showing the use concept of the copper clad laminate provided with a protective layer according to the present invention.

The method of using the copper clad laminate provided with a protective layer 1 according to the present invention will be described referring to FIG. 1. FIG. 1 shows a process of manufacturing the printed wiring board sPCB 3 shown in FIG. 3 with a schematic cross sectional image.

FIG. 1(A) shows the copper clad laminate provided with a protective layer 1 according to the present invention. As is obvious in the figure, the copper clad laminate provided with a protective layer 1 according to the present invention is a double-sided copper clad laminate having the copper layers 3 on both side of the insulating layer constituting material 4, and protective layers 5 is provided on the both side of the double-sided copper clad laminate. Regarding the insulating layer constituting material 4 and the copper layer 3, there is no particular limitation in thickness and type.

As the surface of the double-sided copper clad laminate is provided with the protective layer 5, biting performance of a drill edge is improved in forming of through holes. As a result, the damage such as scratches and abrasions on the surface of the copper layers 3 caused by irregular action of a drill edge is prevented in forming of a conduction isolation portion 6 by drilling. Further, a plating resist adhered and remaining around the opening of the through holes for providing of a conduction isolation portion 6 can be completely removed by removing of the protective layer 5 after the through holes for providing of a conduction isolation portion 6 is filled with the plating resist. The method of removing the protective layer 5 from the surface of the copper clad laminate may includes a method of removal by polishing and removal by swelling by immersing the copper clad laminate in a solvent, in addition to mechanical releasing. However, mechanical releasing is preferable from the point of view of operating efficiency and manufacturing cost.

Thickness of the protective layer 5 is preferable to be 2 μm to 50 μm. If thickness of the protective layer 5 is 2 μm or more, releasing from the copper layer surface of the copper clad laminate never cause tearing. Further, the biting performance of a drill edge at the start of drilling may also be improved and damage on the copper foil surface should be prevented. Further, thickness of the protective layer 5 is preferable to be 50 μm or less from the following reason. In the releasing of the protective layer 5 after filling of the through holes for providing of a conduction isolation portion 6 with a plating resist, the plating resist 2 having thickness corresponding to that of the protective layer 5 may project from the surface of the printed wiring board to form a level difference (hereinafter referred to as a "plating resist projection"), as can be understood in FIG. 1(D). If thickness of the protective layer 5 is 50 μm or less, the level difference of the plating resist projection might be absorbed by the insulating layer constituting material 4 laminated on both side in lamination step in manufacturing of a multilayered printed wiring board and the wiring co-planarity of the copper layer 3 is secured. From the same point of view, thickness of the protective layer 5 is more preferable to be 5 μm to 30 μm, further preferable to be 10 μm to 20 μm.

The protective layer 5 may be provided by forming on a double-sided copper clad laminate, or laminating copper foil provided with the protective layer 5 on both-side of an insulating layer constituting material such as pre-preg. So, in manufacturing of a copper clad laminate provided with a protective layer, a heat of about 160° C. to 240° C. for 60 min to 120 min is loaded. As a result, the protective layer 5 is preferable to be a resin layer composed of a resin component removable from the copper layer surface of the copper clad laminate even after loading the heat in manufacturing.

Next, the embodiments of each copper clad laminate provided with a protective layer 1 based on the embodiments of the first to the fourth protective layers will be described below.

<Copper Clad Laminate Provided with the First Protective Layer>

The protective layer 5 in the copper clad laminate provided with the first protective layer 1 is a resin layer constituted by a resin film.

The resin film layer to be the protective layer 5 is preferable to be made of one or more resin components selected from polyimide, polyamide, polyamide-imide, polybenzimidazole, polyethersulfone, a liquid crystal polymer, syndiotactic polystyrene, polyether ether ketone, polysulfone, polyphenylene sulfide, polyether imide, cycloolefin, polyethylene terephthalate, polybutylene terephthalate, polymethylpentene, ultra-high molecular weight polyethylene, polyvinylidene fluoride, polyethylene naphthalate, polyolefin, a fluorine-contained resin, an ethylene-tetrafluoroethylene copolymer, polyacetal, polycarbonate, polyphenylene ether, polyarylate, phenoxy, and a styrene-butadiene copolymer. This is because the resin components described above do not cause contamination on the copper layer 3 of a copper clad laminate by the gas generation of an excess volatile content if the resin components are heated in manufacturing of the copper clad laminate.

The method of forming the protective layer 5, a resin film layer in the copper clad laminate provided with the first protective layer 1 is preferable to be any one of the following "Method A of forming a protective layer", "Method B of forming a protective layer", and "Method C of forming a protective layer", but not limited thereto.

Method A of forming a protective layer: The method A forms the resin layer to be the protective layer 5 in the copper clad laminate provided with the first protective layer 1 according to the present invention by coating the resin varnish containing the resin components described above.

The method of manufacturing the copper clad laminate provided with the first protective layer 1 according to the present invention is preferable to use copper foil provided with a resin layer. The copper foil provided with a resin layer is applied a resin varnish containing the resin component described above on one side of copper foil to provide a resin layer to be a protective layer 5. Then, the copper clad laminate provided with the first protective layer 1 having a resin layer to be a protective layer 5 is manufactured by laminating the copper foil provided with a resin layer to both side of an insulating layer constituting material 4 such as pre-preg while contacting the copper foil in the copper foil provided with a resin layer to the insulating layer constituting material. If the copper foil provided with a resin layer is used, the surface of copper foil can be free from scratches and the adhesion of foreign matter and contaminants in manufacturing of the copper clad laminate provided with the first protective layer 1.

Further, the method is also preferable to use a double-sided copper clad laminate in manufacturing of the copper clad laminate provided with the first protective layer 1 according to the present invention. That is, the copper clad laminate provided with the first protective layer 1 provided the protective layers 5 is manufactured by providing resin layers to be the protective layers 5 through coating of the resin varnish containing the resin component described above on the copper layer surfaces of the double-sided copper clad laminate.

The method A of forming a protective layer is preferable to use polyimide, polyamide, polyamide-imide, polybenzimidazole, polyethersulfone, polyarylate, polysulfone, polyether imide, polyphenylene sulfide, polyarylate, phenoxy, a styrene-butadiene copolymer as a resin component to make preparation of the varnish easy.

Method B of forming a protective layer: The method B coats the re-melted resin component described above in forming of a resin layer to be the protective layer 5 of the copper clad laminate provided with the first protective layer 1 according to the present invention, and the following methods are preferable to be employed.

The method B is preferable to use the copper foil provided with a resin layer in manufacturing of the first copper clad laminate with the first protective layer 1 according to the present invention. The copper foil provided with a resin layer is provided the resin layer to be the protective layer 5 by coating the fluidized re-melted cured resin containing the resin component described above on one side of copper foil to constitute a resin layer to be the protective layer 5. Then, the copper foil provided with a resin layer is used in manufacturing of the copper clad laminate provided with the first protective layer 1 according to the present invention in the same manner as in the case of the method A of forming a protective layer. If the copper foil provided with a resin layer is used, the same effect as that described in the method A of forming a protective layer is achieved.

Further, the method B using a double-sided copper clad laminate is also preferable in manufacturing of the copper clad laminate provided with the first protective layer 1 according to the present invention. That is, the fluidized re-melted cured resin containing the above-described resin component is coated on both copper layer surfaces of the double-sided copper clad laminate to provide resin layers to be the protective layers 5 to manufacture the copper clad laminate provided with the first protective layer 1 provided the protective layers 5 on both sides.

In the method B of forming a protective layer, a resin component to be used in the method coating the fluidized re-melted resin component described above is preferable to be selected from polyimide, polyamide, polyamide-imide, polybenzimidazole, polyethersulfone, a liquid crystal polymer, polymethylpentene, syndiotactic polystyrene, polyether ether ketone, polysulfone, polyphenylene sulfide, polyether imide, cycloolefin, polyethylene terephthalate, polybutylene terephthalate, ultra-high molecular weight polyethylene, polyvinylidene fluoride, polyethylene naphthalate, polyolefin, a fluorine-contained resin, an ethylene-tetrafluoroethylene copolymer, polyacetal, polycarbonate, polyphenylene ether, polyarylate, phenoxy, a styrene-butadiene copolymer.

Method C of forming a protective layer: The method C forms the resin layer to be the protective layer 5 of the copper clad laminate provided with the first protective layer 1 according to the present invention by laminating a resin film made of the resin component described above, and the following method is preferable to be employed.

The method using copper foil provided with a resin layer is preferable in manufacturing of the copper clad laminate with a protective layer 1 according to the present invention. The copper foil provided with a resin layer is prepared by using a resin film made of a resin component for forming of a resin layer to be the protective layer 5 and laminating the resin film by hot-press lamination on the surface of copper foil. Then, the copper clad laminate provided with the first protective layer 1 having a resin layer to be a protective layer 5 made of a resin film is manufactured by laminating the copper foil provided with a resin layer on both side of an insulating layer constituting material 4 such as pre-preg while contacting the copper foil in the copper foil provided with a resin layer to the insulating layer constituting material. If the copper foil provided with a resin layer is used, the same effect as that described in the method A of forming a protective layer is achieved.

The method B using a double-sided copper clad laminate is also preferable in manufacturing of the copper clad laminate provided with the first protective layer 1 according to the present invention. That is, the copper clad laminate provided with the first protective layer 1 is manufactured by laminating the resin film by hot-press lamination on the copper layer surface of the double-sided copper clad laminate to provide a resin layer to be the protective layer 5. Further, the copper clad laminate provided with the first protective layer 1 provided the protective layers 5 on both side is also manufactured by arranging an insulating layer constituting material such as pre-preg, copper foil, and a resin film in this order and laminating them all at once.

The method C of forming a protective layer is preferable to use a resin component constituting the resin film selected from polyimide, polyamide, polyamide-imide, polybenzimidazole, polyethersulfone, a liquid crystal polymer, syndiotactic polystyrene, polyether ether ketone, polysulfone, polyphenylene sulfide, polyether imide, cycloolefin, polyethylene terephthalate, polybutylene terephthalate, ultra-high molecular weight polyethylene, polyvinylidene fluoride, polyethylene naphthalate, polyolefin, a fluorine-contained resin, an ethylene-tetrafluoroethylene copolymer, polyacetal, polycarbonate, polyphenylene ether, polyarylate, phenoxy, a styrene-butadiene copolymer.

<Copper Clad Laminate Provided with the Second Protective Layer According to the Present Invention>

The protective layer 5 of the copper clad laminate provided with the second protective layer 1 according to the present invention is a resin layer, and the resin layer is composed of a "resin film layer" and an "adhesive layer". The copper clad laminate provided with the second protective layer 1 is provided an adhesive layer between the protective layer 5 (single resin layer) manufactured by the method C of forming a protective layer of the copper clad laminate provided with the first protective layer 1 and the copper layer 3 of the copper clad laminate. If the construction is employed, the bond strength of a protective layer is controlled by an adhesive and applicable physical property range of the alternative resin film layers are made wide.

For the resin film, the resin components described on "copper clad laminate provided with the first protective layer 1" can be used. Then, the adhesive layer is preferable to be constituted by a component containing one or more selected from a rubber-based material, a silicone resin, and an acrylic resin. The adhesive layer containing such a resin component can maintain adhesion even after loading heat at a highest temperature (of about 240° C.) employed in the manufacturing of a copper clad laminate. Further, in releasing of the protective layer 5 from the copper layer surface, the protective layer 5 can be released without leaving the adhesive layer on the surface of the copper clad laminate. Further, the adhesive layer may be constituted by the material in which the bond strength of the resin component of the adhesive layer is reduced or lost by the methods, immersing of the copper clad laminate provided with the second protective layer 1 in water or irradiating of UV light on the surface of the protective layer 5.

Thickness of the adhesive layer and thickness of the resin film described above should be adjusted to make the total thickness of the protective layer 5 described above 2 μm to 50 μm. Further, thickness of the adhesive layer is preferable to be 2 μm to 45 μm. Thickness of the adhesive layer is preferable to be 2 μm or more because adhesion stability is drastically improved. In addition, thickness of the adhesive layer of 45 μm or less makes amount of adhesive layer adhere to a drill edge in drilling small and workability of the drill stable.

The methods of manufacturing the copper clad laminate provided with the second protective layer 1 include the following two types. The first method previously prepares "copper foil provided with a resin film layer and an adhesive layer" and laminate them to both side of the insulating layer constituting material 4 such as pre-preg. The procedure makes the surface of copper foil free from scratches and adhesion of foreign matter and contaminants in lamination to the insulating layer constituting material 4.

The other method applies adhesive layers on both side of the double-sided copper clad laminate composed of the insulating layer constituting material 4 and copper foil followed by laminating of a resin film. The method improves manufacturing efficiency of the entire laminate because double-sided copper clad laminates, precursors of sPCB 1 to sPCB 4 in FIG. 3 are manufactured in the same process.

<Copper Clad Laminate Provided with the Third Protective Layer>

The protective layer of the copper clad laminate provided with the third protective layer 1 has reinforcing metal layer on the surface, and has a layer structure of "reinforcing metal layer/resin film layer" as a protective layer of two-layer structure car a layer structure of "reinforcing metal layer/resin film layer/adhesive layer" as a protective layer of three-layer structure. As a reinforcing metal foil is provided, reduction of tearing defect of the protective layer 5 in releasing of a protective layer is ensured.

The manufacturing method of the copper clad laminate provided with the third protective layer 1 can use "reinforcing metal foil provided with a resin film layer" or "reinforcing metal foil provided with a resin layer and an adhesive layer". The reinforcing metal foil is preferable to be a metal foil composed of any component of copper, a copper alloy, aluminum, an aluminum alloy, nickel, and a nickel alloy to secure good drill ability. Thickness of the reinforcing metal foil is preferable to be 1 μm to 35 μm if the total thickness of the protective layer 5 is 3 μm to 50 μm. Thickness of the reinforcing metal foil is preferable to be 1 μm or more because the reinforcing effect on the protective layer 5 is secured, and tearing may not occur in the metal foil constituting the reinforcing metal layer in releasing of the protective layer even released together. Further, thickness of the reinforcing metal foil of 35 μm or less makes a load in drilling small and makes forming of through holes for providing of a conduction isolation portion high-precision.

If the protective layer of the copper clad laminate provided with the third protective layer 1 has a layer structure of "reinforcing metal layer/resin film layer/adhesive layer" and the total thickness of the protective layer 5 should be 4 µm to 50 µm, thickness of the reinforcing metal layer is preferable to be 1 µm to 35 µm, thickness of the resin film layer is preferable to be 1 µm to 35 µm and thickness of the adhesive layer is preferable to be 2 µm to 45 µm from the point of view of ensuring stiffness of the protective layer and the level difference elimination properties (leveling performance of the insulating layer on unevenness) of a plating resist projection.

The surface of the copper layer of the copper clad laminate used in manufacturing of the copper clad laminate provided with the third protective layer 1 may be organic rust-proofing treated using imidazole, triazole, benzotriazole, and the like.

<Copper Clad Laminate Provided with the Fourth Protective Layer>

The protective layer of the copper clad laminate provided with the fourth protective layer 1 according to the present invention is composed of the resin layer and the reinforcing metal layer described above and further provided a releasing layer on the surface of the reinforcing metal layer. The layer structure of the protective layer is "resin film layer/reinforcing metal layer/releasing layer" or "adhesive layer/resin film layer/reinforcing metal layer/releasing layer". The layer structures prevent tearing of a sheet to be a protective layer precursor by handling in forming of protective layer, and forming of copper clad laminate provided with a protective layer 1 because an ultra-thin metal layer provided with carrier foil is employed as the reinforcing metal layer and the carrier foil is released after forming of the protective layer. The protective layer 5 of the copper clad laminate provided with the fourth protective layer 1 is preferable to be formed by the following method.

Manufacturing method of the copper clad laminate provided with the fourth protective layer 1 can use composite metal foil having a layer structure of "reinforcing metal layer/releasing layer/carrier foil". The copper clad laminate provided with the fourth protective layer 1 is manufactured through previously forming a "composite metal foil provided with a resin film layer" composed of "resin film layer/reinforcing metal layer/releasing layer/carrier foil" or "adhesive layer/resin film layer/reinforcing metal layer/releasing layer/carrier foil" using the composite metal foil, laminating the "composite metal foil provided with a resin film layer" on a double-sided copper-clad sheet, and then releasing the carrier foil.

The carrier foil is preferable to be composed of any component of copper, a copper alloy, nickel, and a nickel alloy having thickness of 8 µm to 35 µm. If thickness of the carrier foil is 8 µm or more, the handling ability of supporting metal layer may be drastically improved. Further, the reason why thickness of the carrier foil is 35 µm or less is to prevent depression in the supporting metal layer by bending in releasing of the carrier foil. The surface of the carrier foil is preferable to be silane coupling agent treated. Applicable silane coupling agent includes olefin functional silane, epoxy functional silane, vinyl functional silane, acrylic functional silane, amino functional silane, and mercapto functional silane.

In the fourth protective layer, thickness of the reinforcing metal layer is preferable to be 1 µm to 35 µm from the point of view of tearing prevention of reinforcing metal in releasing of the carrier and drill ability. Then, the releasing layer may be any of an organic releasing layer and an inorganic releasing layer. The components used for the organic releasing layer include a nitrogen-containing organic compound, a sulfur-containing organic compound, and a carboxylic acid. The nitrogen-containing organic compound include a triazole compound and an imidazole compound, and among them, a triazole compound is preferable because releasing ability is stable. The triazole compounds include 1,2,3-benzotriazole, carboxybenzotriazole, N',N'-bis(benzotriazolylmethyl)urea, 1H-1,2,4-triazole, and 3-amino-1H-1,2,4-triazole. The sulfur-containing organic compounds include mercaptobenzothiazole, thiocyanuric acid, and 2-benzimidazole thiol. The carboxylic acids include monocarboxylic acid and dicarboxylic acid. The inorganic components applicable for an inorganic releasing layer include Ni, Mo, Co, Cr, Fe, Ti, W, P, Zn, and a chromate film. Thickness of the releasing layer is preferable to be 1 nm to 1 µm, more preferable to be 5 nm to 500 nm, from the point of view of securing the stable releasing strength and avoiding a residue after releasing. Note that the releasing strength of the carrier foil at the releasing layer is preferable to be 1 gf/cm to 100 gf/cm, more preferable to be 3 gf/cm to 50 gf/cm, further preferable to be 5 gf/cm to 10 gf/cm.

In the protective layer of the copper clad laminate provided with the fourth protective layer 1, the total thickness of the protective layer should be 4 µm to 50 µm and thickness of the reinforcing metal layer is preferable to be 1 µm to 35 µm, thickness of the resin film layer is preferable to be 1 µm to 35 µm and thickness of the adhesive layer is preferable to be 2 µm to 45 µm from the point of view of ensuring stiffness of the protective layer and the level difference elimination properties of the insulating resin layer at the plating resist projection. Particularly, if the ultra-thin copper foil in the ultra-thin copper foil provided with carrier foil is employed as a reinforcing metal layer, thickness of the reinforcing metal layer is preferable to be 1 to 8 µm, more preferable to be 1 to 5 µm in terms of the handling ability of the protective layer and ensuring stiffness.

<Method of Forming a Printed Wiring Board Using a Copper Clad Laminate Provided with a Protective Layer>

The use concept of the copper clad laminate provided with a protective layer 1 according to the present invention will be described. As is apparent in FIG. 1(B), on the copper clad laminate provided with a protective layer 1 according to the present invention, through holes for providing of a conduction isolation portion 6 is formed by drilling while the copper clad laminate is provided with a resin layer to be the protective layer 5. After the drilling, the copper clad laminate provided with a protective layer 1 is preferable to be de-smear treated to remove a smear on the inner wall of the through holes for providing of a conduction isolation portion 6.

FIG. 1(C) shows the through holes for providing of a conduction isolation portion 6 formed by drilling after forming the conduction isolation portion 2 for partially isolating electrical connection between layers. Paste or viscous liquid that can be used as a plating resist is preferable to be used for forming the conduction isolation portion 2 as disclosed in Patent Document 1 described above. Note that the plating resist is used for forming a portion not plated, and the plating resist applicable for forming the conduction isolation portion 2 includes a silicon resin, a polyethylene resin, a fluorocarbon resin, a polyurethane resin and an acrylic resin. Then, filling of the plating resist into the inner portion of the through holes for providing of a conduction isolation portion 6 is conducted by filling methods including printing, stencil printing, and needle dispensing. If such a filling method is employed, the plating resist may remain on the surface of the protective layer 5 including the surroundings of the opening of the through holes for providing of a conduction isolation portion 6 just after the formation of the conduction isolation portion 2 shown in FIG. 1(C).

After finishing formation of the conduction isolation portion 2, the printed wiring hoard sPCB 3 shown in FIG. 1(D) is prepared by releasing the protective layer 5 from the surface of the copper layer 3 followed by forming of a wiring. Note that any technique may be used for forming the wiring. For example, the method including steps starting from the state shown in FIG. 1(C), removing only the protective layer 5 on the surface on which a wiring should be formed, laminating an etching resist on the surface; exposing, developing, and etching for a wiring pattern formation; releasing the etching resist to form a wiring only on one side; followed by releasing of the protective layer 5 remaining on the other side in a subsequent arbitrary stage. Note that such method etch only the copper layer 3 on one side is preferable to be applied in the case where the printed wiring board sPCB 1 and the printed wiring board sPCB 4 each having the conduction isolation portion 2 shown in FIG. 3 are provided in the outer layer of a multilayered printed wiring board. Examples and Comparative Examples will be described.

Example 1

Preparation of a copper clad laminate provided with a protective layer: In Example 1, the copper clad laminate provided with a protective layer composed of a single layer of polybenzimidazole resin film was prepared. 10% by mass solution of polybenzimidazole in dimethylacetamide (trade name MRS0810H: manufactured by Advanced Materials Co. Ltd) was used as the resin varnish. The copper foil provided with a protective layer provided a resin layer to be a protective layer 5 having thickness of 15 µm on one side was prepared by coating the resin varnish on the shiny side of the 35 µm thick electrodeposited copper foil using an edge coater followed by drying under a heating condition of 150° C. for 5 min.

The copper foil in the copper foil provided with a protective layer was laminated on both side of a 0.2 mm thick pre-preg under the conditions, a temperature of 200° C. for 60 min with a pressing pressure of 30 kgf/cm² to prepare the copper clad laminate provided with the first protective layer 1 provided the protective layers 5 having thickness of 20 µm on both side.

Evaluation of the protective layer: Evaluation on releasing of the protective layer 5 was conducted for "releasing strength" of a protective layer, "releasing ability" in releasing, and "co-planarity of an inner layer wiring" based on thickness of a protective layer. Evaluation of the releasing of a protective layer was also conducted on Examples and Comparative Examples described later, and results in Examples and Comparative Examples are summarized in Table 1 together.

Example 2

Preparation of a copper clad laminate provided with a protective layer: In Example 2, the copper clad laminate provided with a protective layer in which the protective layer is composed of a single layer of polyethersulfone resin film was prepared. First, the copper foil provided with a protective layer provided a resin layer to be a protective layer 5 having thickness of 20 µm on one side similar to that in Example 1 by using 20% by mass solution of polyethersulfone in dimethylacetamide (trade name PES-5003P: manufactured by Sumitomo Chemical Co., Ltd.) in place of the resin varnish used in Example 1. Then the copper clad laminate provided with the first protective layer 1 was prepared in the same manner as in Example 1.

Example 3

Preparation of a copper clad laminate provided with a protective layer: In Example 3, the copper clad laminate provided with a protective layer in which the protective layer is composed of a single layer of resin film made of a methylpentene polymer was prepared. A methylpentene polymer film (trade name Opyuran: manufactured by Mitsui Chemicals, Inc.) was used in place of the resin varnish used in Example 1. First, the copper foil provided with a protective layer provided a resin layer to be a protective layer 5 having thickness of 25 µm on one side was prepared by laminating the methylpentene polymer film on the shiny side of the 35 µm thick electrodeposited copper foil under the conditions of a temperature of 90° C. for 10 min with a pressing pressure of 10 kgf/cm². Then, the copper clad laminate provided with the first protective layer 1 was prepared in the same manner as in Example 1.

Example 4

Preparation of a copper clad laminate provided with a protective layer: In Example 4, the copper clad laminate provided with a protective layer in which the protective layer is composed of a single layer of resin film made of an ethylene-tetrafluoroethylene copolymer was prepared. First, the ethylene-tetrafluoroethylene copolymer film (trade name AFLEX: manufactured by Asahi Glass Co., Ltd.) was used in place of the resin varnish used in Example 1. The copper foil provided with a protective layer provided a resin layer to be a protective layer 5 having thickness of 25 µm on one side was prepared by laminating the ethylene-tetrafluoroethylene copolymer film on the shiny side of the 35 µm thick electrodeposited copper foil under the same conditions as in Example 3 Then, the copper clad laminate provided with the first protective layer 1 was prepared in the same manner as in Example 1.

Example 5

Preparation of a copper clad laminate provided with a protective layer: In Example 5, the copper clad laminate provided with a protective layer in which the protective layer is composed of a polyimide resin film layer and an adhesive layer was prepared. First, the copper foil provided with a protective layer provided a resin layer to be a protective layer 5 having a total thickness of 50 µm on one side was prepared by laminating a polyimide resin film provided with a pressure-sensitive adhesive (trade name Kapton (registered trademark) tape: manufactured by TERAOKA SEISAKUSHO CO., LTD.) on the shiny side of the 35 µm thick electrodeposited copper. Then, the copper clad laminate provided with the second protective layer 1 was prepared in the same manner as in Example 1.

Example 6

Preparation of a copper clad laminate provided with a protective layer: In Example 6, the copper clad laminate provided with a protective layer in which the protective layer is composed of a polyphenylene ether resin film layer and a reinforcing metal layer was prepared. The resin varnish was prepared by dissolving mixture of 15% by mass of polyphenylene ether and 85% by mass of a styrene-butadiene copolymer in toluene, and adjusted the solid content of the solution to be 20% by mass. Then the resin film layer was formed by coating the resin varnish on the matte side of the 12 μm thick electrodeposited copper foil to make the resin film layer thickness 7 μm using an edge coater and dried at a heating condition of 130° C. for 2 min. Then, copper foil provided with a protective layer having a layer structure of electrodeposited copper foil (12 μm thick)/resin film layer/electrodeposited copper foil (18 μm thick) was prepared by heat laminating the shiny side of 18 μm thick electrodeposited copper foil on the resin film layer.

The copper clad laminate provided with the third protective layer 1 provided protective layers 5 each having a total thickness of 19 μm having two-layer structure of "electrodeposited copper foil (12 μm thick)/resin layer (7 μm thick)" on both side was prepared by laminating electrodeposited copper foil (18 μm thick) in the copper foil provided with a protective layer on both side of the 0.2 mm thick pre-preg under the conditions of a temperature of 200° C. for 60 min with a pressing pressure of 30 kgf/cm².

Example 7

Preparation of a copper clad laminate provided with a protective layer: In Example 7, the protective layer composed of "resin film layer/reinforcing metal layer/releasing layer/carrier foil" was prepared. First, the electrodeposited copper foil provided with carrier foil was used as composite metal foil having a layer structure of "reinforcing metal layer/releasing layer/carrier foil". The electrodeposited copper foil provided with carrier foil used is stack of "ultra-thin copper foil (3 μm thick) serving as a reinforcement metal layer" and "copper foil (18 μm thick) which is carrier foil" via "releasing layer formed by using carboxybenzotriazole".

Then, the composite metal foil provided with a protective layer having a layer structure of "resin film layer/reinforcing metal layer/releasing layer/carrier foil" provided a resin layer to be a protective layer 5 having thickness of 15 μm was prepared by coating the same resin varnish as in Example 1 on the surface of the ultra-thin copper foil in the electrodeposited copper foil provided with carrier foil (composite metal foil) to be 15 μm thick resin film layer using an edge coater on one side and dried under a heating condition of 150° C. for 5 min.

Then, the protective layer precursor having a layer structure of electrodeposited copper foil (18 μm thick)/resin film layer/reinforcing metal layer (3 μm thick)/releasing layer/carrier foil was prepared by heat laminating shiny side of the 18 μm thick electrodeposited copper foil on the surface of the resin layer. The copper clad laminate provided with the fourth protective layer 1 provided protective layers 5 on both side each having a three-layer structure of "resin film layer/reinforcing metal layer/releasing layer" with total thickness of 18 μm was prepared by laminating 0.1 mm thick pre-preg on the electrodeposited copper foil (18 μm thick) in the protective layer precursor under the conditions of a temperature of 200° C. for 60 min with a pressing pressure of 30 kgf/cm², followed by releasing carrier foil.

Example 8

Preparation of a copper clad laminate provided with a protective layer: In Example 8, the copper clad laminate provided with the first protective layer 1 provided protective layers 5 each 10 μm thick on both sides was prepared in the same manner as in Example 1. Example 8 was conducted in the same manner as in Example 1.

Comparative Example 1

Preparation of a copper clad laminate provided with a protective layer: In Comparative Example 1, an epoxy resin film layer was provided by using the epoxy resin varnish in place of the resin varnish used in Example 1 for a protective layer. The resin varnish having a resin solid content of 60% by mass was prepared by dissolving 79 parts by weight of a bisphenol-A type epoxy resin (trade name: Epotohto YD-128, manufactured by Tohto Kasei Co., Ltd.), 6 parts by weight of an o-cresol novolac type epoxy resin (trade name: Epiclon N-680, manufactured by DIC Corporation), 15 parts by weight of 4,4'-diaminodiphenyl sulfone (trade name: Seika Cure S, manufactured by Wakayama Seika Kogyo Co., Ltd.), and 0.4 parts by weight of a curing accelerator 2-methylimidazole (trade name: 2MZ, manufactured by Shikoku Chemicals Corporation) in a mixed solvent of methyl ethyl ketone and dimethylformamide to prepare a resin varnish. Then, the copper foil provided with a protective layer provided a resin layer to be a protective layer 5 having thickness of 5 μm on one side was prepared in the same manner as in Example 1 by using the resin varnish, and the copper clad laminate provided with a protective layer was prepared in the same manner as in Example 1.

Comparative Example 2

Comparative Example 2 was conducted in the same manner as in Example 1 except that thickness of the resin film layer of the protective layer in Example 1 was changed to 1 μm.

Comparative Example 3

Comparative Example 3 was conducted in the same manner as in Example 1 except that thickness of the resin film layer of the protective layer in Example 1 was changed to 55 μm.

<Evaluation of Protective Layer>

Evaluation of the protective layer was conducted on the items described below.

(1) Measurement of Releasing Strength

Straight protective layer of 10 mm width for measurement were formed on the surface of the copper clad laminate provided with a protective layer prepared in Examples and Comparative Examples and releasing strength F (gf/cm) of the straight protective layer were measured by releasing at an angle of 90° at a stroke of 5 m/min. Grade of the releasing strength F (gf/cm) were judged as following.

AA (best): $5 \leq F \leq 10$

A (good): $3 \leq F < 5$ or $10 < F \leq 50$

B (acceptable): $1 \leq F < 3$ or $50 < F \leq 100$, and releasable

C (not good): not releasable (2) Evaluation of Releasing Ability

Tearing rate P (%) of a protective layer in releasing of the protective layer from a copper clad laminate provided with a protective layer in ten sheets prepared in Examples and Comparative Examples were determined and grade were judged as following.

AA (best): P=0

A (good): $0 < P \leq 10$

B (acceptable): $10 < P \leq 50$

C (not good): $50 < P$ or not releasable (3) Evaluation on co-planarity of the surface of the insulation layer constituting material and the inner layer wiring: through holes for providing of a conduction isolation portion (through hole) having a diameter of 0.3 mm were formed by drilling the copper clad laminates provided with a protective layer prepared in Examples and Comparative Examples, and a plating resist were filled into the holes and dried and cured at 150° C. for 120 min. After releasing the protective layers, the copper clad laminates in which a plating resist project from the surface of the copper clad laminates at the portion of the through holes for providing of a conduction isolation portion with a height corresponding to thickness of the protective layer released were prepared. The laminates serving as a precursor of a printed wiring board were prepared by laminating the double-sided copper-clad laminates on both side of the copper clad laminate via a 100 µm thick pre-preg at a temperature of 200° C. for 60 min with a pressing pressure of 30 kgf/cm². After that, cross sectional image of the laminates were observed, and the level difference height S (µm) between an inner layer wirings just above the through holes filled with a plating resist and an inner layer wirings that are not filled with a plating resist were measured. Further, grade of co-planarity were judged by the following value of the level difference height S (µm).

A (good): 0≤S<15
B (acceptable): 15≤S<30
C (not good): 30≤S or impossible to prepare sample (4) Overall grade judgement: According to the evaluation grades described above, the overall grade was judged by the following criteria.

C (not good): one or more C-grades
B (acceptable): one or more B-grades
AA (excellent): two or more AA-grades
A (good): other than the above AA-, B-, and C-grades Comparison Among Examples and Comparative Examples Examples will be compared with Comparative Examples using the data in Table 1.

As is apparent in Table 1, Examples in which the materials of the resin film layer constituting a protective layer satisfy the scope of the present invention are good in releasing strength and releasing ability. Further, Examples in which thickness of a protective layer satisfy the scope of the present invention are good in releasing ability and small in level difference height of an inner layer wiring. Further, the protective film provided a reinforcing metal layer having thickness satisfying the scope of the present invention is very good because occurrence of tearing in releasing is zero.

INDUSTRIAL APPLICABILITY

As is apparent in the descriptions above, the copper clad laminate provided with a protective layer according to the present invention keeps the protective layer on the surface of the copper clad laminate in processing of forming of the through holes for providing of a conduction isolation portion by drilling and filling of the through holes for providing of a conduction isolation portion with a plating resist, and the protective layer is released and removed after finishing the processing. So, the plating resist adhered and remain around the opening of the through holes for providing of a conduction isolation portion after filling the plating resist can be completely removed. Therefore, in the method of manufacturing a multilayered printed wiring board disclosed in Patent Document 1, the copper clad laminate provided with a protective layer according to the present invention is suitable material used in manufacturing a printed wiring board with lamination all at once.

SYMBOL LIST

1 Copper clad laminate provided with a protective layer
2 Conduction isolation portion
3 Copper layer
4 Insulating layer constituting material
5 Protective layer

TABLE 1

| Specimen | Layer structure of protective layer[1] | Resin material constituting resin film layer | Total thickness of protective layer (µm) | Evaluation results on releasing | | | | Evaluation of laminate leveling | | Overall gradet |
|---|---|---|---|---|---|---|---|---|---|---|
| | | | | Releasing strength (gf/cm) | Grade | Tearing (%) | Grade | Level difference height of inner layer wiring (µm) | Grade | |
| Example 1 | Type 1 | Polybenzimidazole | 15 | 45 | A | 10 | A | 6 | A | A |
| Example 2 | Type 1 | Polyethersulfone | 20 | 40 | A | 10 | A | 9 | A | A |
| Example 3 | Type 1 | Methylpentene polymer | 25 | 1 | B | 10 | A | 15 | B | B |
| Example 4 | Type 1 | ETFE polymer | 25 | 6 | AA | 10 | A | 16 | B | B |
| Example 5 | Type 2 | Polyimide | 50 | 48 | A | 10 | A | 27 | B | B |
| Example 6 | Type 3 | Polyphenylene ether | 19 | 19 | A | 10 | A | 12 | A | A |
| Example 7 | Type 4 | Polybenzimidazole | 18 | 9 | AA | 0 | AA | 12 | A | AA |
| Example 8 | Type 1 | Polybenzimidazole | 10 | 43 | A | 30 | B | 5 | A | B |
| Comparative Example 1 | Type 1 | Epoxy resin | 5 | Not releasable | C | Not releasable | C | Impossible to prepare | C | C |
| Comparative Example 2 | Type 1 | Polybenzimidazole | 1 | Not releasable | C | Not releasable | C | Impossible to prepare | C | C |
| Comparative Example 3 | Type 1 | Polybenzimidazole | 55 | 40 | A | 10 | A | 37 | C | C |

*[1]Type 1: Single layer of resin film layer
Type 2: Resin film layer/adhesive layer
Type 3: Resin film layer/reinforcing metal layer (copper foil)
Type 4: Resin film layer/reinforcing metal layer (copper foil)/releasing layer 6 through holes for providing of a conduction isolation portion
7 Through holes for forming through hole
10 Multilayered printed wiring board
TH1, TH2 Through hole
sPCB 1, sPCB 2, sPCB 3, sPCB 4 Printed wiring board

What is claimed is:

1. A copper clad laminate used for manufacturing of a printed wiring board having a conduction isolation portion that electrically isolates at least one through hole, comprising:
   at least one copper layer; and
   a protective layer provided on an outer surface of the at least one copper layer, wherein
   the protective layer is configured to be mechanically released from the at least one copper layer after the at least one through hole is provided in the printed wiring board and after the through hole is filled with a plating resist to provide the conduction isolation portion of the printed wiring board,
   the protective layer has a thickness between 2 μm and 50 μm,
   the protective layer has a resin layer that can be released from the surface of the copper clad laminate after heating at 160° C. to 240° C. for 60 min to 120 min,
   the resin layer is comprised of a resin film layer and an adhesive layer formed on the surface of the resin film layer between the copper layer and the resin film layer, and the adhesive layer is configured to be released from the surface of the copper clad laminate,
   the protective layer has the resin film layer, the adhesive layer formed on the surface of the resin film layer between the copper layer and the resin film layer, and a reinforcing metal layer on an outside surface of the resin film layer, and
   the resin film layer comprises at least one component selected from the group consisting of polyimide, polyamide, polyamide-imide, polybenzimidazole, polyethersulfone, a liquid crystal polymer, syndiotactic polystyrene, polyether ether ketone, polysulfone, polyphenylene sulfide, polyether imide, cycloolefin, polyethylene terephthalate, polybutylene terephthalate, polymethylpentene, ultra-high molecular weight polyethylene, polyvinylidene fluoride, polyethylene naphthalate, polyolefin, a fluorine-containing resin, an ethylene-tetrafluoroethylene copolymer, polyacetal, polycarbonate, polyphenylene ether, polyarylate, phenoxy resin, and a styrene-butadiene copolymer.

2. The copper clad laminate according to claim 1, wherein the adhesive layer contains at least one component selected from the group consisting of a rubber-based material, a silicone resin, and an acrylic resin.

3. The copper clad laminate according to claim 1, wherein the protective layer is comprised of the resin layer, the reinforcing metal layer provided on the outside surface of the resin layer, and a releasing layer provided on the outside surface of the reinforcing metal layer.

4. The copper clad laminate according to claim 3, wherein the releasing layer is comprised of at least one organic agent selected from the group consisting of a nitrogen-containing organic compound, a sulfur-containing organic compound and a carboxylic acid.

5. The copper clad laminate according to claim 3, wherein the releasing layer has a thickness of 1 nm to 1 μm.

6. The copper clad laminate according to claim 1, wherein the reinforcing metal layer comprises at least one metal selected from the group consisting of copper, a copper alloy, aluminum, an aluminum alloy, nickel, and a nickel alloy.

7. The copper clad laminate according to claim 1, wherein the reinforcing metal layer has a thickness of 1 μm to 35 μm.

8. The copper clad laminate according to claim 1, wherein the resin film layer has a thickness of 1 μm to 35 μm, the adhesive layer has a thickness of 2 μm to 45 μm, and the reinforcing metal layer has a thickness of 1 μm to 35 μm.

9. A multilayered printed wiring board manufactured by using the copper clad laminate according to claim 1.

* * * * *